(12) United States Patent
Yu

(10) Patent No.: US 10,629,746 B2
(45) Date of Patent: Apr. 21, 2020

(54) ARRAY SUBSTRATE AND MANUFACTURING METHOD THEREOF

(71) Applicant: Wuhan China Star Optoelectronics Semiconductor Display Technology Co., Ltd., Wuhan, Hubei (CN)

(72) Inventor: Wei Yu, Shenzhen (CN)

(73) Assignee: WUHAN CHINA STAR OPTOELECTRONICS SEMICONDUCTOR DISPLAY TECHNOLOGY Co., LTD., Wuhan (CN)

( * ) Notice: Subject to any disclaimer, the term of this patent is extended or adjusted under 35 U.S.C. 154(b) by 93 days.

(21) Appl. No.: 15/576,188

(22) PCT Filed: Oct. 21, 2017

(86) PCT No.: PCT/CN2017/107179
§ 371 (c)(1),
(2) Date: Nov. 21, 2017

(87) PCT Pub. No.: WO2019/056447
PCT Pub. Date: Mar. 28, 2019

(65) Prior Publication Data
US 2019/0221671 A1    Jul. 18, 2019

(30) Foreign Application Priority Data
Sep. 20, 2017 (CN) .......................... 2017 1 0870202

(51) Int. Cl.
*H01L 21/02* (2006.01)
*H01L 29/786* (2006.01)
(Continued)

(52) U.S. Cl.
CPC ...... *H01L 29/78618* (2013.01); *H01L 21/265* (2013.01); *H01L 21/266* (2013.01);
(Continued)

(58) Field of Classification Search
CPC ............. H01L 29/786; H01L 29/78618; H01L 29/78678; H01L 29/66765;
(Continued)

(56) References Cited

U.S. PATENT DOCUMENTS

2011/0084276 A1* 4/2011 Kang ................ H01L 29/78609
257/57
2012/0241743 A1 9/2012 Shen et al.
(Continued)

FOREIGN PATENT DOCUMENTS

CN    105070726 A    11/2015
CN    105789327 A    7/2016
(Continued)

*Primary Examiner* — Chuong A Luu
(74) *Attorney, Agent, or Firm* — Brinks Gilson & Lione

(57) ABSTRACT

The present disclosure discloses an array substrate and manufacturing method thereof. The method includes: forming a gate layer on the surface of a substrate; forming an insulating layer on the surface of the gate layer; forming a polysilicon layer having a separating portion on the surface of the insulating layer; and forming a source drain layer on the surface the polysilicon layer having the separating portion, such that the source drain layer is not directly in contact with the polysilicon layer. Through the above-mentioned method, the contact resistance of the source drain layer and the amorphous silicon layer is effectively improved, thereby effectively reducing the leakage current, and the characteristic of TFT device is greatly improved.

8 Claims, 8 Drawing Sheets

(51) Int. Cl.
   *H01L 29/66*     (2006.01)
   *H01L 21/266*    (2006.01)
   *H01L 21/265*    (2006.01)
   *H01L 29/06*     (2006.01)

(52) U.S. Cl.
   CPC ........ *H01L 29/06* (2013.01); *H01L 29/66765* (2013.01); *H01L 29/786* (2013.01); *H01L 29/78678* (2013.01); *H01L 29/78696* (2013.01); *H01L 21/02488* (2013.01); *H01L 21/02532* (2013.01); *H01L 21/02592* (2013.01); *H01L 21/02672* (2013.01); *H01L 21/26513* (2013.01); *H01L 29/78633* (2013.01)

(58) Field of Classification Search
   CPC ........ H01L 29/78675; H01L 29/78696; H01L 29/78633; H01L 29/78669; H01L 29/06; H01L 29/66; H01L 29/66757; H01L 27/12; H01L 27/124; H01L 27/1274; H01L 27/1285; H01L 27/1288; H01L 27/1255; G02F 1/1333; G02F 1/133345; G02F 1/1335; G02F 1/133514; G02F 1/1368; G02F 1/1362; G02F 1/136286
   USPC ........................................................ 257/66
   See application file for complete search history.

(56) References Cited

U.S. PATENT DOCUMENTS

| | | |
|---|---|---|
| 2016/0276606 A1 | 9/2016 | Fong et al. |
| 2017/0154773 A1 | 6/2017 | Zhou et al. |
| 2017/0154901 A1* | 6/2017 | Nodera ............... H01L 27/1222 |
| 2018/0097120 A1* | 4/2018 | Ishida .................. H01L 29/786 |

FOREIGN PATENT DOCUMENTS

| | | |
|---|---|---|
| CN | 106057827 A | 10/2016 |
| CN | 106711155 A | 5/2017 |
| JP | 2005057056 A | 3/2005 |

* cited by examiner ical field, or control organic luminescent material to display images through currents. Such displays generally need to realize the driving and the control of pixels through thin-film transistor (TFT) array substrate.

ARRAY SUBSTRATE AND MANUFACTURING METHOD THEREOF

CROSS-REFERENCE TO RELATED APPLICATIONS

The present application is a 35 U.S.C. § 371 National Phase conversion of International (PCT) Patent Application No. PCT/CN2017/107179 filed Oct. 21, 2017, which claims foreign priority of Chinese Patent Application No. 201710870202.5, filed on Sep. 20, 2017 in the State Intellectual Property Office of China, the contents of all of which are hereby incorporated by reference.

TECHNICAL FIELD

Embodiments of the present disclosure generally relate to liquid crystal display technology, and in particular relate to an array substrate and manufacturing method thereof.

BACKGROUND

Liquid crystal display (LCD) and organic light-emitting diode (OLED) display images by controlling the light transmittance of liquid crystals (LCs) through electric field, or control organic luminescent material to display images through currents. Such displays generally need to realize the driving and the control of pixels through thin-film transistor (TFT) array substrate.

In order to achieve high resolution requirements, the current TFT array substrate mostly adopt low-temperature polysilicon (LTPS) manufacturing process. Due to the characteristics of high electron mobility, good subthreshold swing, big on/off state current ratio, low power consumption, can be applied to flexible OLED substrate, etc., LTPS has aroused widespread concern in recent years. Due to the conventional LTPS production utilizes excimer laser annealing (ELA) to crystallize, which the machine is expensive, the production cost is high, and cannot produce large sized display panel because of poor homogeneity in ELA crystallization which tend to cause uneven brightness. A new solid phase crystallization (SPC) is began to attract the attention of the industry since it is low in cost and has good crystal homogeneity, and can significantly reduce the temperature and the time required for crystallization if a certain amount of boron ion is implanted before crystallization.

As shown in FIG. 1, the conventional production method of LTPS implants boron ion into amorphous silicon, and deal with the amorphous silicon through rapid thermal annealing. The upper surface of the amorphous silicon will form a polysilicon conductor layer 101 of a small impedance, and the lower portion will form a semiconductor-like polysilicon layer 102. Metal electrode(s) of a source drain layer 103 are utilized to perform dry etching for a mask, so as to etch away the polysilicon conductor layer 101 on the upper surface of a channel area to form a channel, and finally a passivation layer 104 is covered on to completed the TFT device. However, since the source drain layer 103 and the semiconductor-like polysilicon layer 102 of the lower portion are in contact, which will increase the leakage current path so that the leakage current is increased, and the characteristics of the TFT is affected.

Therefore, it is necessary to provide an array substrate and a manufacturing method thereof to resolve the above-mentioned technical problem.

SUMMARY

The technical problem to be resolved by the present disclosure is to provide an array substrate and a manufacturing method thereof, which achieves the objective of reducing the electrical leakage by changing the direct contact of the source drain layer and the polysilicon layer in the conventional structure, thereby greatly improving the characteristics of TFT devices.

In order to resolve the above-mentioned technical problem, the first technical scheme adopted by the present disclosure is: providing a manufacturing method for an array substrate, including: forming a gate layer on the surface of a substrate; forming an insulating layer on the surface of the gate layer; forming an amorphous silicon layer on the insulating layer by patterning; providing a photoresist on the patterned amorphous silicon layer, in which the width of the opening of the photoresist is smaller than the width of the amorphous silicon layer; removing the photoresist after photomasking, and performing crystallizing on the amorphous silicon layer; forming a polysilicon layer having a separating portion; depositing and patterning a source drain layer, and etching to form a channel on the source drain layer, wherein the source electrode and the drain electrode in the source drain layer are separated by the channel; and depositing a passivation layer on the surfaces of the source electrode and the drain electrode.

In order to resolve the above-mentioned technical problem, the second technical scheme adopted by the present disclosure is: providing another manufacturing method for an array substrate, including: forming a gate layer on the surface of a substrate; forming an insulating layer on the surface of the gate layer, forming a polysilicon layer having a separating portion on the surface of insulating layer; and forming a source drain layer on the surface of the polysilicon layer having the separating portion, in which the separating portion separates the source drain layer and the polysilicon layer.

In order to resolve the above-mentioned technical problem, the third technical scheme adopted by the present disclosure is: providing an array substrate, including: a gate layer, an insulating layer, a polysilicon layer, and a source drain layer successively formed on a substrate; in which, the polysilicon layer includes a separating portion separating the source drain layer and the polysilicon layer, and the electron mobility of the separating portion is lesser than the electron mobility of the polysilicon layer.

The present disclosure has the advantages that the present disclosure can greatly improve the contact resistance by changing the direct contact of the source drain layer and the polysilicon layer in the conventional structure, and utilizing the separating portion to separate the polysilicon layer and the source drain layer, thereby achieving the objective of greatly reducing the electrical leakage, and the characteristic of TFT devices is greatly improved. In addition, the present disclosure replaces the excimer laser annealing crystallization by implanting the boron ion in solid phase crystallization, which effectively improves the homogeneity problem caused by the excimer laser annealing crystallization while greatly reduces the temperature and the time required for crystallization, thereby effectively reduce the production cost.

DETAILED DESCRIPTION

Figure 1:
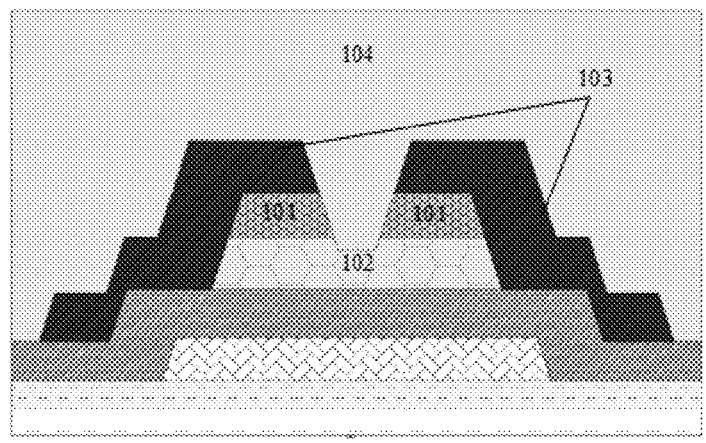
FIG. 1 is a schematic diagram of the structure of an array substrate of the prior art.
Figure 2:
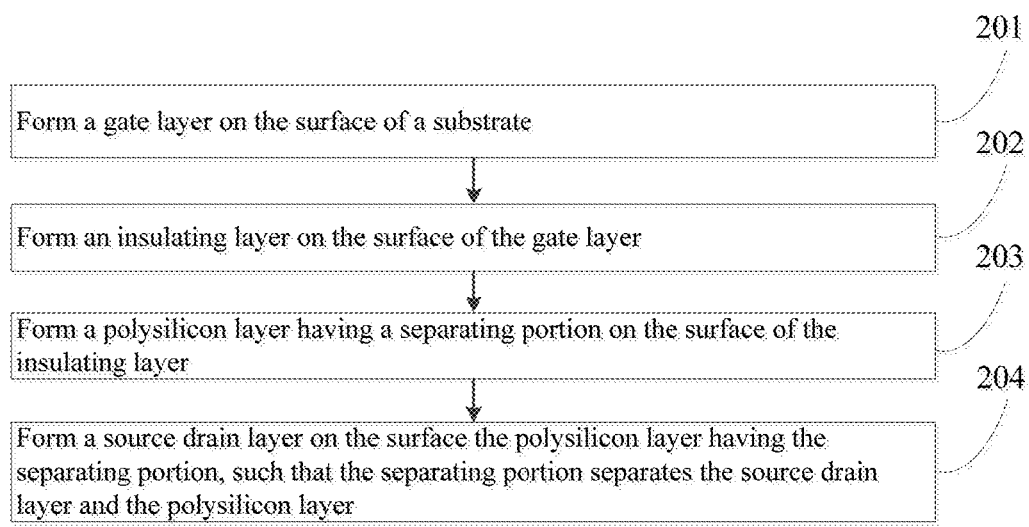
FIG. 2 is a flow chart of an embodiment of a manufacturing method for an array substrate of the present disclosure.

Referring to FIG. 2, a flow chart of an embodiment of a manufacturing method for an array substrate of the present disclosure is depicted. The method may include the following blocks.

At 201: forming a gate layer on the surface of a substrate.

Specifically, the substrate is placed in a deposition chamber, a metal layer is formed by vapor deposition, and the metal layer is patterned to form a gate layer. In which, a buffer layer is deposited on the substrate before forming the metal layer, and the buffer layer may be provided with a light shielding layer and an ion blocking layer according to the use of the array substrate, which is not repeated herein.

The substrate may be made of at least one kind of glass and quartz. In other embodiments, it may be made of other kinds of transparent material, which is not limited herein.

At 202: forming an insulating layer on the surface of the gate layer.

In which, the gate insulating layer is formed by physical or chemical vapor deposition. In which, the gate insulating layer includes at least one kinds of silicon nitride SiNx and amorphous silicon oxide SiOx.

At 203: forming a polysilicon layer having a separating portion on the surface of the insulating layer.

Specifically, an amorphous silicon layer is formed on the insulating layer by patterning, a photoresist is provided on the patterned amorphous silicon layer, implantes boron ion in the amorphous silicon layer, and the photoresist is removed after photomasking, in which the width of the opening of the photoresist is smaller than the width of the amorphous silicon layer.

Optionally, a recess is defined in a predetermined region in the middle of the insulating layer, the amorphous silicon layer is deposited on the insulating layer, and the amorphous silicon layer in the groove is retained; a polysilicon conductor layer is formed in the groove by depositing, and the boron ion is implanted into the polysilicon conductor layer performs crystallization on the amorphous silicon layer.

In an optional embodiment, rapid thermal annealing technique can be adopted to crystallize on the amorphous silicon layer.

In a specific embodiment, the amorphous silicon layer may crystallize at the temperature of 650° C. In other embodiments, the amorphous silicon layer may crystallize at other temperatures such as 700° C. and 640° C., as long as the crystallization of the amorphous silicon layer can be achieved in accordance with the standard, which is not limited herein. The baking time can be 15 minutes, 14 minutes, or 16 minutes are also permitted, which is not limited herein.

In another embodiment, the dopant ion, i.e., boron ion and phosphorus ion, can be diffused through excimer laser annealing, so as to form the polysilicon layer, which is not limited herein.

At 204: forming a source drain layer on the surface of the polysilicon conductor layer having the separating portion, such that the source drain layer is not directly in contact with the polysilicon layer.

In which, the source drain layer is deposited and patterned, and is etched to form a channel on the source drain layer, in which the source electrode and the drain electrode (in the source drain layer) are separated by the channel; and a passivation layer is deposited on the surfaces of the source electrode and the drain electrode.

Specifically, a source electrode and a drain electrode separated by a channel are formed on the polysilicon conductor layer, and an insulating passivation layer is deposited on the surface of a thin film transistor after the gate electrode, the source electrode and the drain electrode are formed.

The present disclosure will now be further described with reference to the accompanying drawings.

Figure 3:
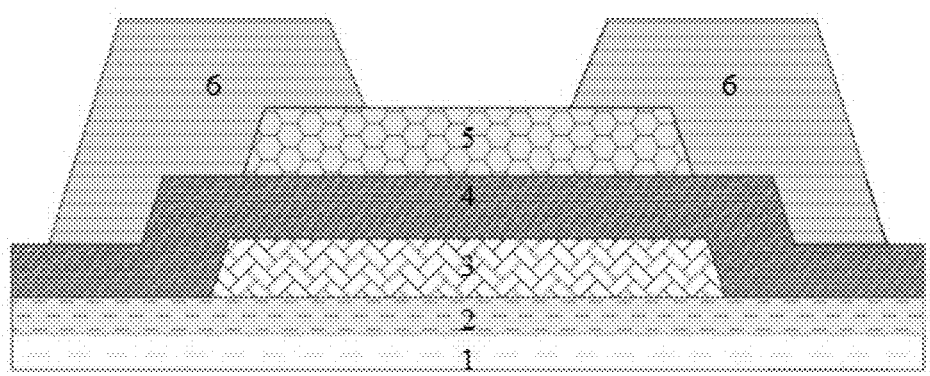
FIG. 3 is a structural flow chart of a manufacturing method for an array substrate according to one embodiment of the present disclosure.
Figure 4:
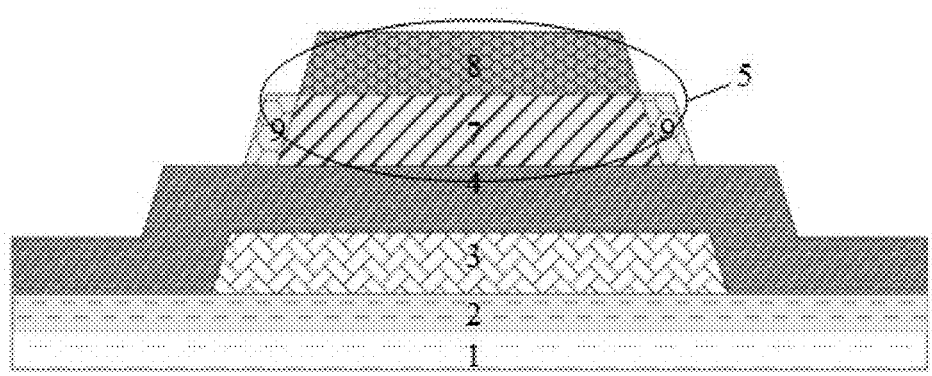
FIG. 4 is a structural flow chart of a manufacturing method for an array substrate according to one embodiment of the present disclosure.
Figure 5:
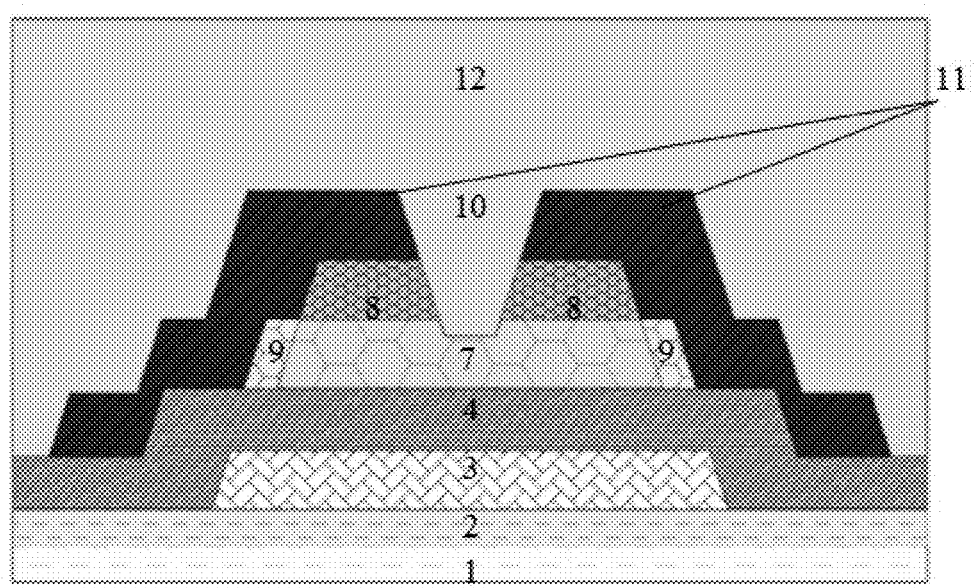
FIG. 5 is a structural flow chart of a manufacturing method for an array substrate according to one embodiment of the present disclosure.

As shown in FIGS. 3-5, the manufacturing process of an array substrate according to an embodiment of the present embodiment is as follows.

As shown in FIG. 3, a substrate 1 is placed in a deposition chamber, and a buffer layer 2 is formed on the substrate 1 utilizing plasma enhanced chemical vapor deposition (PECVD), in which the buffer layer 2 includes a shading layer and an ion blocking layer (not shown) after lithography; and then PECVD is utilized again to form a gate layer 3 on the buffer layer 2 through deposition and patterning, and then an insulating layer 4 is formed on the gate layer 3 through deposition and patterning, an amorphous silicon layer 5 is provided on the patterned insulating layer 4 and patterned, and a layer of photoresist 6 is provided on two sides of the patterned amorphous silicon layer 5 and patterned (as shown in FIG. 4), such that the width of the amorphous silicon layer 5 is larger than the width of the opening of the photoresist 6 on the two sides.

As shown in FIG. 4, a certain dose of boron ion is further implanted through ion implantation technique, in which the carrier of the boron ion may be a mixed gas of $B_2H_6$ and $H_2$. The photoresists are removed after photomasking, and the solid phase crystallization process is performed on the amorphous silicon layer 5 through rapid thermal annealing. The rapid thermal annealing is utilized to crystallize on the amorphous silicon layer at 650° C., the crystallization is performed from the upper surface to the lower portion, the upper surface of the amorphous silicon layer 5 will form a polysilicon conductor layer 8 of a small impedance, and the lower portion of the polysilicon conductor layer 8 will form a semiconductor-like polysilicon layer 7. Since the width of the amorphous silicon layer 5 is larger than the width of the opening of the photoresists 6 on the two sides, and the film of the photoresists 6 blocks the implantation of the ion on the two sides so that the two sides of the amorphous silicon layer 5 are not adulterated with boron ion and retain the state of amorphous silicon on the two sides to form an amorphous silicon separating portions 9.

As shown in FIG. 5, an source electrode and an drain electrode (SD electrode) are deposited and patterned to form a source drain layer 11, and the polysilicon conductor layer 8 is etched with the SD electrode as a bunker so as to etch away the polysilicon conductor layer 8 on the upper surface of a channel 10 and the semiconductor-like polysilicon layer 7 on the lower portion of the channel 10 is retained, and then a passivation layer 12 is formed by patterning to cover the channel 10, and finally the manufacture of the array substrate is completed after verification is passed.

Different from the prior art, this embodiment replaces the conventional excimer laser annealing crystallization by adopting the solid phase crystallization in the process of crystallization, which greatly reduces the temperature and the time required for the crystallization, and effectively reduces the production cost. In addition, in this embodiment, the direct contact of the source drain layer and the polysilicon layer in the conventional structure is changed, and the amorphous silicon is utilized to contact the source drain layer so that the contact resistance is greatly improved, thereby achieving the objective of greatly reducing the electrical leakage, and the characteristic of TFT devices is greatly improved.

Figure 6:
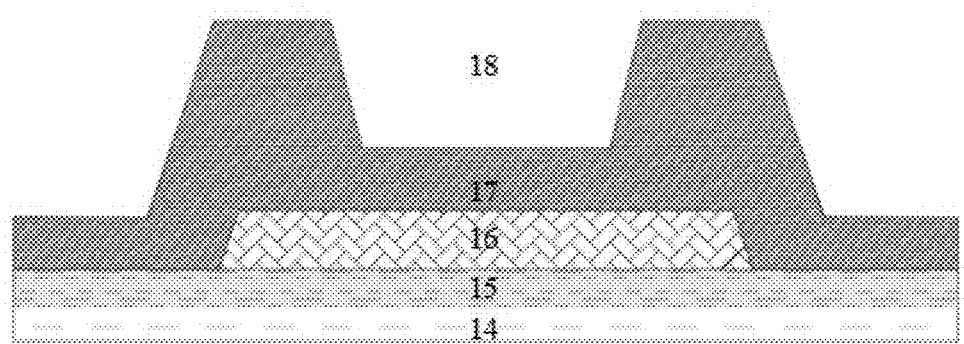
FIG. 6 is a structural flow chart of another manufacturing method for an array substrate according to one embodiment of the present disclosure.
Figure 7:
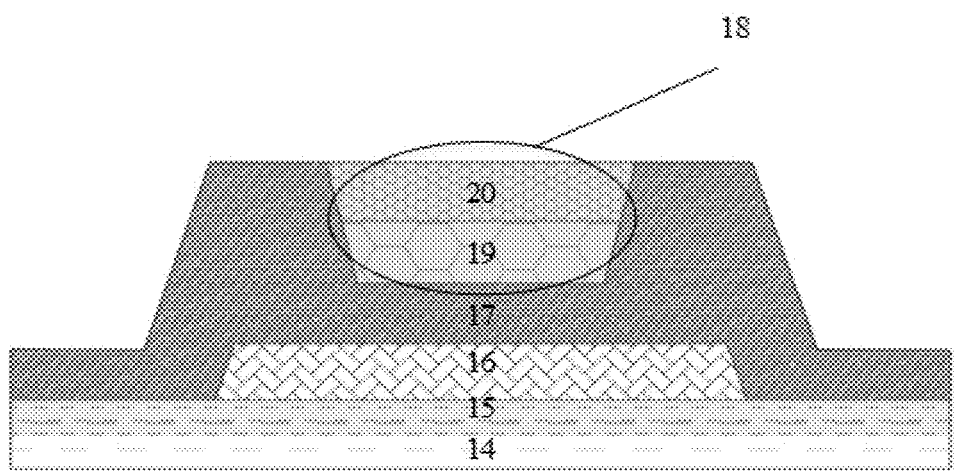
FIG. 7 is a structural flow chart of another manufacturing method for an array substrate according to one embodiment of the present disclosure.
Figure 8:
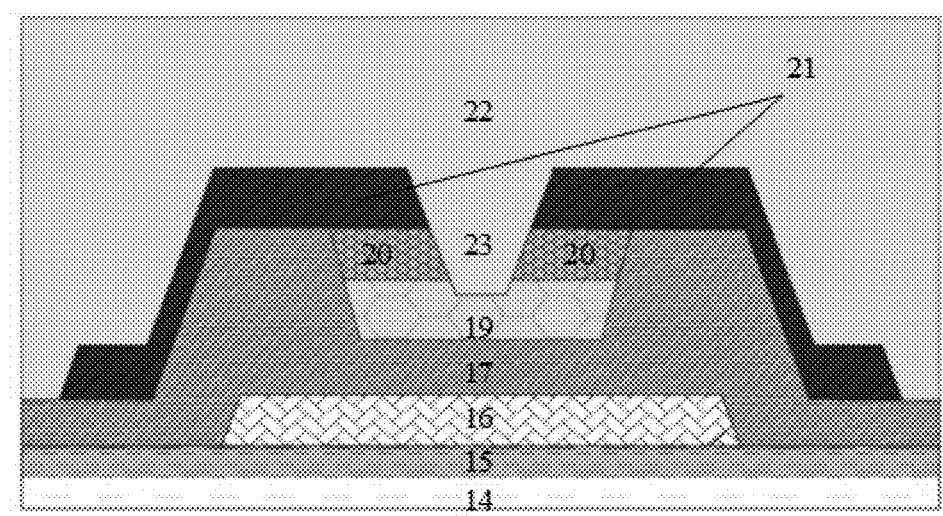
FIG. 8 is a structural flow chart of another manufacturing method for an array substrate according to one embodiment of the present disclosure.

As shown in FIGS. 6-8, the manufacturing process of an array substrate according to another embodiment of the present embodiment is as follows.

As shown in FIG. 6, a substrate 14 is placed in a deposition chamber, and a buffer layer 15 is formed on a substrate 14 utilizing PECVD, in which the buffer layer 15 includes a shading layer and an ion blocking layer (not shown) after lithography; and then PECVD is utilized again to form a gate layer 16 on the buffer layer 15 through deposition and patterning; an insulating layer 17 is formed on the gate layer 16 through deposition and patterning, a recess 18 (as shown in FIG. 6) is defined in a predetermined region of an insulating layer 17 (generally, the middle portion of the insulating layer 17).

As shown in FIG. 7, an amorphous silicon layer (not shown) is formed in the recess 18, a polysilicon conductor layer 20 (see FIG. 7) is formed on the amorphous silicon layer, and solid phase crystallization is performed on the amorphous silicon layer after adding an appropriate amount of $B_2H_6$. When baked at 650° C. for about 15 minutes, the crystallization proceeds from the upper surface to the lower portion, and the polysilicon conductor layer 20 on the upper surface of the amorphous silicon layer does not change, and the lower portion of the polysilicon conductor layer 20 will form a semiconductor-like polysilicon layer 19.

As shown in FIG. 8, an SD electrode (source electrode and drain electrode) is deposited and patterned to form a source drain layer 21, and etches the polysilicon conductor layer 20 with the SD electrode as a bunker so as to etch away the polysilicon conductor layer 20 on the surface of a channel 23 (see FIG. 8) and the semiconductor-like polysilicon layer 19 on the lower portion of the channel 23 is retained, and then a passivation layer 22 is formed by patterning to cover the channel 23, and finally the manufacture of the array substrate is completed after verification is passed.

Different from the above-mentioned embodiment, the separating portion of this embodiment adopts the side wall of the recess on the insulating layer to replace the separating portion formed of an amorphous silicon material, which further improves the contact resistance, thereby achieving the objective of greatly reducing the electrical leakage, and the characteristic of TFT device is greatly improved. In addition, in contrast to the above-mentioned embodiment, this embodiment omits the process of disposing and removing the photoresist, which further reduces the production cost and improves the production efficiency.

The present disclosure also provides an array substrate including a gate layer, an insulating layer, a polysilicon layer, and a source drain layer are successively formed on a substrate, in which the polysilicon layer includes a separating portion, the separating portion separated the source drain layer from the polysilicon layer and the electron mobility of the separating portion is lesser than the electron mobility of the polysilicon layer.

In which, a buffer layer is provided on a substrate, the buffer layer includes a shading layer and an ion blocking layer after lithography, a gate layer is provided on the buffer layer, and an insulating layer is provided on the gate layer, a polysilicon layer and a source drain layer are provided on the insulating layer; separation portions are provided on two sides of the polysilicon layer, thereby achieving the objective of greatly reducing the electrical leakage.

Specifically, an array substrate manufacturing method includes: forming a gate layer on the surface of a substrate; forming an insulating layer on the surface of the gate layer, forming a polysilicon layer having a separating portion on the surface of insulating layer; and forming a source drain layer on the surface of the polysilicon layer having the separating portion, such that the source drain layer is not directly in contact with the polysilicon layer.

In a specific embodiment, as shown in FIGS. 3-5, which includes a substrate 1, a buffer layer 2, a gate layer 3, an insulating layer 4, an amorphous silicon layer 5, a photoresist 6, a polysilicon layer 7, a polysilicon conductor layer 8, an amorphous silicon separating portion 9, a channel 10, a source drain layer 11, and a passivation layer 12; in which the buffer layer 2 may be adjusted to a plurality of layers according to a specific array substrate specification; in which the polysilicon layer 7 includes a separating portion 9, the separating portion 9 separates the source drain layer 11 and the polysilicon layer 7, and the electron mobility of the separating portion 9 is lesser than the electron mobility of the polysilicon layer 7.

In which, the separating portion is formed of an amorphous silicon material.

Specifically, the material of the amorphous silicon separating portion is an amorphous silicon material, which is generally two magnitudes different from the polysilicon. Therefore, in comparison with directly contacting with the polysilicon, the resistance can be greatly improved when the source drain layer contacts the amorphous silicon layer, thereby achieving the objective of greatly reducing the electrical leakage.

In another specific embodiment, as shown in FIGS. 6-8, which includes a substrate 14, a buffer layer 15, a gate layer 16, an insulating layer 17, a recess 18, a polysilicon layer 19, a polysilicon conductor layer 20, a source drain layer 21, and a passivation layer 22; in which the buffer layer 15 may be adjusted to a plurality of layers according to a specific array substrate specification; in which the polysilicon layer 19 includes a separating portion 23 (not shown), the separating portion 23 separates the source drain layer 21 and the polysilicon layer 19, and the electron mobility of the separating portion 23 is lesser than the electron mobility of the polysilicon layer 19; the separating portion is the side wall of the recess 18 on the insulating layer 17.

In which, the separating portion adopts the side wall of the recess on the insulating layer to replace the separating portion formed of an amorphous silicon material, which further improves the contact resistance, thereby achieving the objective of greatly reducing the electrical leakage, and the characteristic of TFT device is greatly improved.

Different from the prior art, this embodiment can greatly improve the contact resistance by changing the direct contact of the source drain layer and the polysilicon layer in the conventional structure, and utilizing the separating portion to separate the polysilicon layer and the source drain layer so that the contact resistance is greatly improved, thereby achieving the objective of greatly reducing the electrical leakage, and the characteristic of TFT device is greatly improved.

The foregoing is merely embodiments of the present disclosure, and is not intended to limit the scope of the present disclosure. Any equivalent structure or flow transformation made based on the specification and the accompanying drawings of the present disclosure, or any direct or indirect applications of the disclosure on other related fields, shall all be covered within the protection of the present disclosure.

What is claimed is:

1. An array substrate, comprising:
    a gate layer, an insulating layer, a polysilicon layer, and a source drain layer successively formed on a substrate;
    wherein the polysilicon layer comprises a separating portion separating the source drain layer and the polysilicon layer, and the electron mobility of the separating portion is lesser than the electron mobility of the polysilicon layer;
    wherein the insulating layer is etched with a recess, the separating portion is a sidewall of the recess on the insulating layer.

2. The array substrate of claim 1, wherein the separating portion is formed of an amorphous silicon material.

3. The array substrate of claim 1, wherein the polysilicon layer is formed by performing crystallizing on the amorphous silicon layer at 650° C. through rapid thermal annealing.

4. The array substrate of claim 1, wherein the gate layer is formed by etching a metal layer formed through vapor deposition.

5. The array substrate of claim 1, wherein the insulating layer is formed through physical or chemical deposition.

6. The array substrate of claim 1, wherein the source electrode and the drain electrode in the source drain layer are separated by a channel, the channel is formed by etching after depositing and patterning a source drain layer on a polysilicon layer having a separating portion.

7. The array substrate of claim 6, wherein a passivation layer is deposited on the surfaces of the source electrode and the drain electrode.

8. The array substrate of claim 1, further comprising:
    a buffer layer, formed between a substrate and a gate layer, the buffer layer is a light shielding layer or an ion blocking layer.

* * * * *